(12) United States Patent
Yang et al.

(10) Patent No.: US 10,855,261 B2
(45) Date of Patent: Dec. 1, 2020

(54) LEVEL SHIFTER WITH DETERMINISTIC OUTPUT DURING POWER-UP SEQUENCE

(71) Applicant: SEMICONDUCTOR COMPONENTS INDUSTRIES, LLC, Phoenix, AZ (US)

(72) Inventors: Jianan Yang, Austin, TX (US); James Nissen, Austin, TX (US); David Wade Eickbusch, Austin, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/175,392

(22) Filed: Oct. 30, 2018

(65) Prior Publication Data

US 2020/0136596 A1 Apr. 30, 2020

(51) Int. Cl.
*H03K 19/0175* (2006.01)
*H03K 3/356* (2006.01)
*H03K 19/0185* (2006.01)

(52) U.S. Cl.
CPC . *H03K 3/356182* (2013.01); *H03K 3/356113* (2013.01); *H03K 19/018521* (2013.01)

(58) Field of Classification Search
CPC ... H03K 19/018521; H03K 19/018528; H03K 19/00315; H03K 19/00361; H03K 3/356113; H04L 25/028; H04L 25/0272; G11C 8/08; G11C 5/145; G11C 7/12
See application file for complete search history.

(56) References Cited

U.S. PATENT DOCUMENTS

| 7,770,037 | B2 * | 8/2010 | Searles | G06F 1/28 327/143 |
| 2006/0192587 | A1 * | 8/2006 | Bhattacharya | H03K 3/012 326/80 |
| 2009/0096484 | A1 * | 4/2009 | Jao | H03K 3/356113 326/68 |
| 2010/0275051 | A1 | 10/2010 | Searles et al. | |
| 2016/0149579 | A1 | 5/2016 | Trivedi et al. | |

* cited by examiner

*Primary Examiner* — Long Nguyen
(74) *Attorney, Agent, or Firm* — Brake Hughes Bellermann LLP

(57) ABSTRACT

Level-shifting circuits including a plurality of p-type metal oxide semiconductor (PMOS) devices and n-type metal oxide semiconductor (NMOS) devices may be used to level-shift an input voltage signal between a low voltage domain having a low voltage level and a high voltage domain having a high voltage level, to obtain an output voltage signal having an output voltage level at an output node. A current-controlled tie circuit may be connected between the output node and the output voltage level, to conduct a current that causes the output node of the level-shifting circuit to be in a pre-defined logic state during a power-up sequence of the level-shifting circuit. Accordingly, spurious, non-deterministic output levels are avoided during the power-up sequence.

20 Claims, 5 Drawing Sheets

LEVEL SHIFTER WITH DETERMINISTIC OUTPUT DURING POWER-UP SEQUENCE

TECHNICAL FIELD

This description relates to level shifting circuits.

BACKGROUND

Level-shifting circuits are used to translate logic signals between low and high voltage domains. For example, level-shifting circuits are used to translate a logic low (or high) in a first voltage domain to a logic low (or high) in a second voltage domain. During normal operations of level-shifting circuits, both the first voltage and the second voltage are on, powered-up, and stable.

During a power-up sequence of a level-shifting circuit, however, at least one of the first voltage and the second voltage may not yet be on, or may be in a ramping state. During such scenarios, an output of the level-shifting circuit may be non-deterministic. As a result, any circuit(s) connected to an output of the level-shifting circuit may receive a spurious input, which may lead to unpredictable or incorrect operations of such circuit(s).

SUMMARY

According to one general aspect, level-shifting circuits including a plurality of p-type metal oxide semiconductor (PMOS) devices and n-type metal oxide semiconductor (NMOS) devices may be used to level-shift an input voltage signal between a low voltage domain having a low voltage level and a high voltage domain having a high voltage level, to obtain an output voltage signal having an output voltage level at an output node. A current-controlled tie circuit may be connected between the output node and the output voltage level, to conduct a current that causes the output node of the level-shifting circuit to be in a pre-defined logic state during a power-up sequence of the level-shifting circuit.

The details of one or more implementations are set forth in the accompanying drawings and the description below. Other features will be apparent from the description and drawings, and from the claims.

DETAILED DESCRIPTION

In the various examples described herein, and in variations thereof, level-shifting circuits include circuits (tie-high or tie-low circuits, and/or contention removal circuits) that are operable and effective during a power-up sequence to provide deterministic outputs (e.g., a pre-defined logic state) during the power-up sequence, but that have minimal or no effect on the level-shifting circuits once the power-up sequence completes and a normal operating regime is reached.

In this way, it is not necessary to provide additional/external control or enable signals to the level-shifting circuits in order to obtain deterministic outputs during power-up sequences. For example, such deterministic outputs may include a pre-defined logic state of "logic high" (or "1"), or, alternatively, "logic low" (or "0").

Moreover, power consumption during the normal operating regime is reduced, as compared to other techniques for managing power-up sequences in level-shifting circuits. Further, the described techniques are effective despite a range of process variations that may occur during the manufacture of level-shifting circuits. For example, transistors in level-shifting circuits may have varying levels of sub-threshold leakage currents, due to such process variations, and the described techniques are effective across such varying levels.

Figure 1:
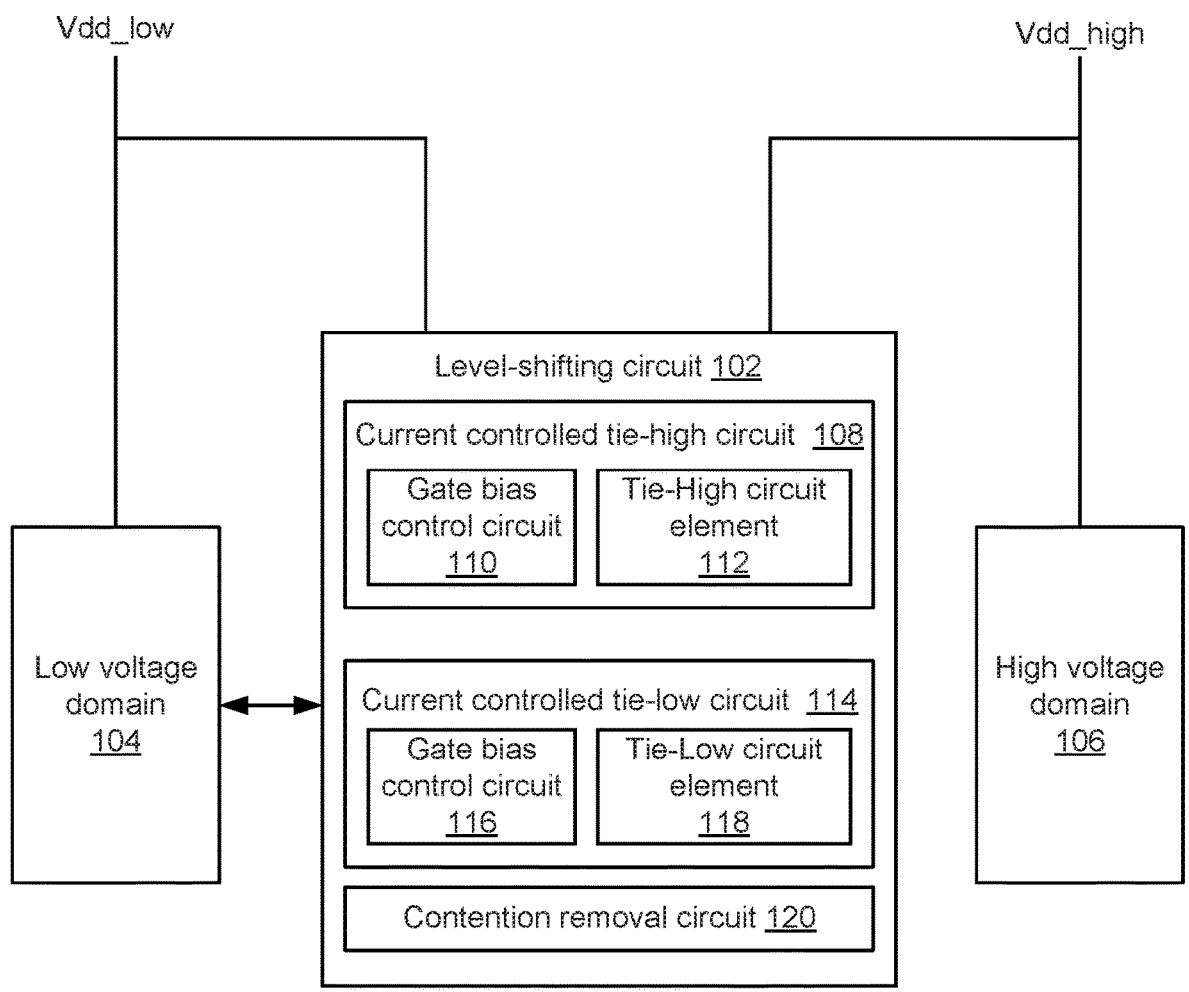
FIG. 1 is a circuit diagram of a level-shifting circuit with a deterministic output during a power-up sequence.

FIG. 1 is a circuit diagram of a level-shifting circuit 102 with a deterministic output during a power-up sequence. Level-shifting circuits, including the level-shifting circuit 102 of FIG. 1, are generally configured and used to translate logic signals between a low voltage domain 104 and a high voltage domain 106. For example, in some implementations a high voltage value in the low voltage domain 104, such as 1.2V (e.g., logic value of "1"), is not high enough to register as a logic value of "1" in the high-voltage domain 106 (which may be, e.g., 2.8V). Of course, many different voltage values may be used in the low-voltage domain 104 and the high-voltage domain 106, and the level-shifting circuit 102 may be adjusted and configured as needed to accommodate accurate logic translations therebetween.

In FIG. 1, a power-up sequence occurs when one or both of the low voltage domain 104 and the high voltage domain 106 transition from an off state, through a ramping state, to an on state. For example, in some implementations the circuits of FIG. 1 are included in a mobile phone, or other type of electronic device. When the device is turned on, in some implementations the high voltage domain 106 ramps and reaches a stable value before the low voltage domain 104 is turned on, or before the low voltage domain 104 completes ramping to reach its stable value. More generally, during such power-up sequences, the domains 104, 106 may exhibit various combinations of off/ramping/on, as well as transitions between such combinations, before both domains 104, 106 reach stable, "on" values.

As referenced above, during such power-up sequences, an output of a standard level-shifting circuit may be non-deterministic. For example, in such standard level-shifting circuits, a logic "0" at the low voltage domain 104 might be translated and output as a logic "1" in the high voltage domain 106, or a logic "1" at the low voltage domain 104 might be output as a logic "0" in the high voltage domain 106. Moreover, due to variations in manufacturing processes and other factors, it is not always possible even to predict such incorrect outcomes. Consequently, in the examples of such standard level-shifting circuits, one or more circuits within the high voltage domain 106 may receive incorrect input signals, and may thus operate in an unexpected and incorrect manner.

In the example of FIG. 1, the level-shifting circuit 102 ensures that an output of the level-shifting circuit 102 is maintained at a known state during various power-up sequences, and thus provides a deterministic output. For example, the level-shifting circuit 102 may be maintained at a logic "0" or logic "1" during power-up sequences in which the high voltage domain 106 is ramping or on, prior to the low voltage domain 104 reaching an on state.

To provide these and related features and advantages, the level-shifting circuit 102 includes a current-controlled tie-high (CCTH) circuit 108. As described in detail below, the CCTH circuit 108 provides a current that is large enough to drive (e.g., tie) an output voltage to a desired state or value during a power-up sequence of the level-shifting circuit 102, but small enough to avoid impact on operations of the level-shifting circuit 102 once the level-shifting circuit 102 reaches a normal operating regime. For example, the current may include a subthreshold current of a transistor that continues to occur during the normal operating region without affecting the level-shifting operations of the level-shifting circuit 102.

Moreover, as the power-up sequences are inherently transient, the CCTH circuit 108 provides fast operations over a wide range of input frequencies. Still further, the CCTH circuit 108 may be configured to consume reduced (e.g., minimal) space on an integrated circuit (IC) chip on which the level-shifting circuit 102 is constructed.

Figure 4:
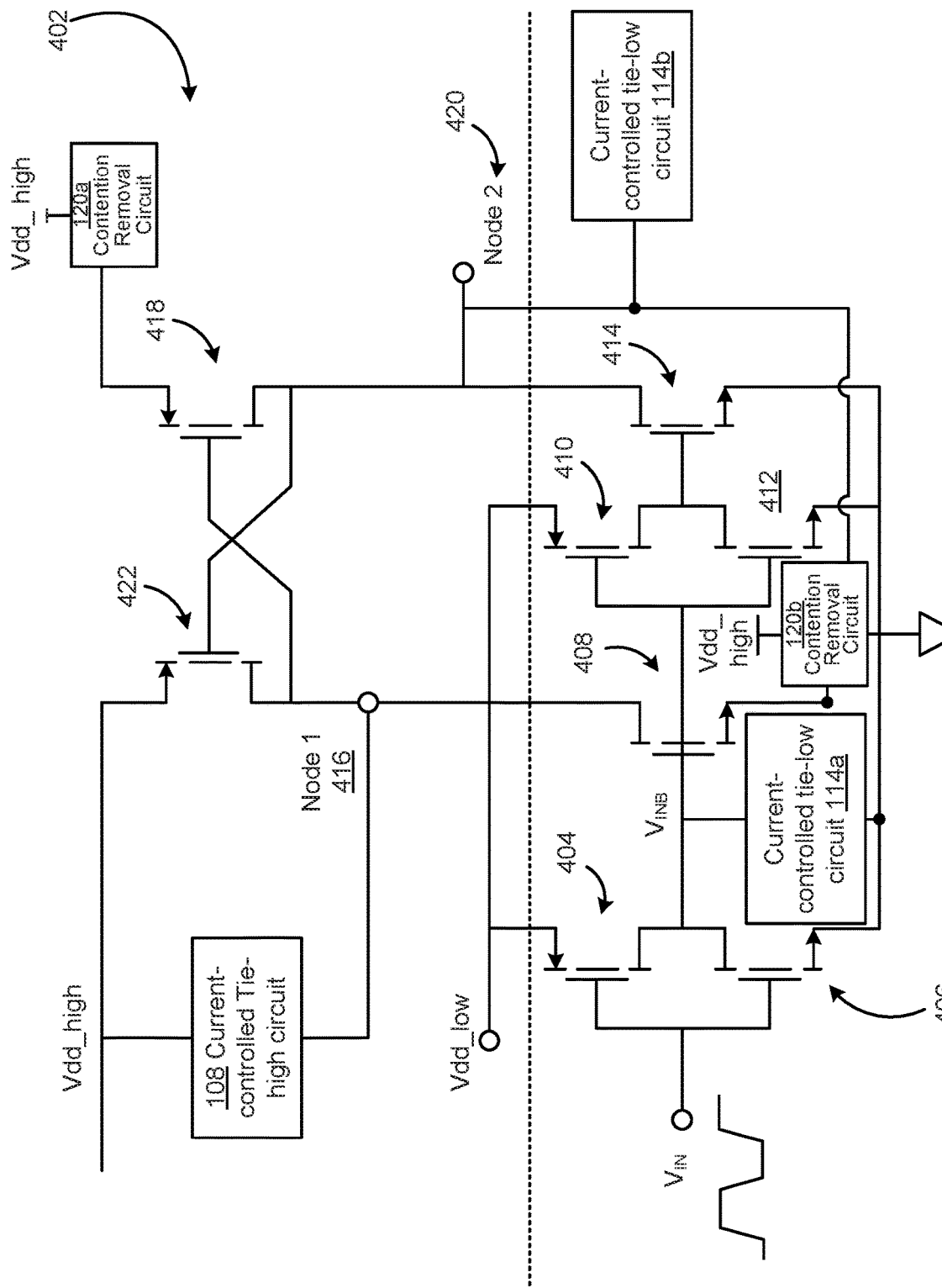
FIG. 4 is a more detailed example of the circuit of FIG. 1.
Figure 5:
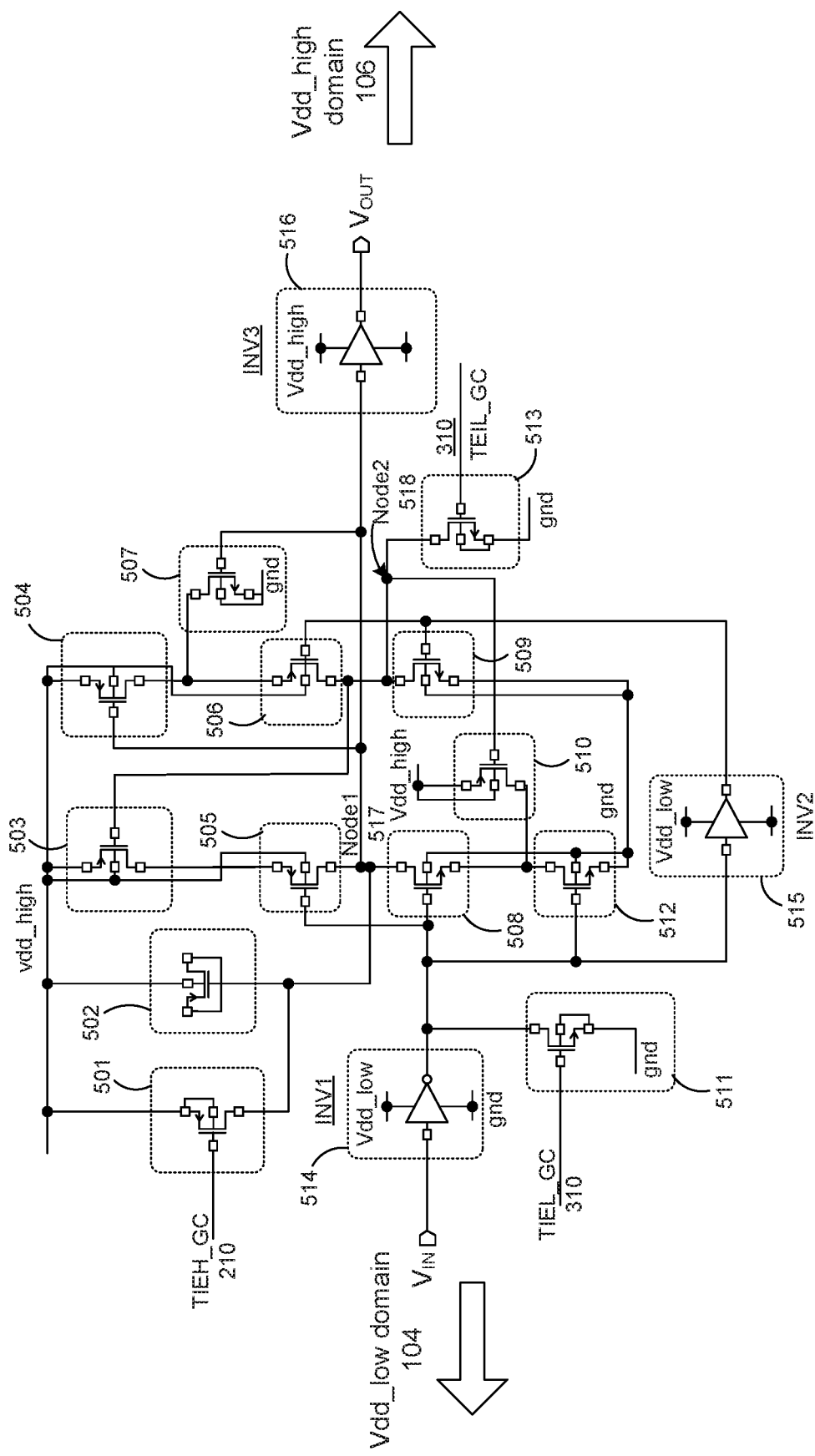
FIG. 5 is a more detailed example of the circuit of FIG. 4.

In FIG. 1, the CCTH circuit 108 includes a gate bias control circuit 110, which is configured to control a gate bias voltage of a tie-high circuit element 112. More particularly, as illustrated and described below, e.g., with respect to FIG. 2, the gate bias control circuit 110 and the tie-high circuit element 112 may each represent or include a plurality of circuit elements, but in general, the gate bias control circuit 110 implements voltage division to provide a controlled (reduced) voltage at a gate of at least one transistor represented by (or included in) the tie-high circuit element 112. Then, as illustrated in the examples of FIGS. 4 and 5, the CCTH circuit 108 is positioned and connected within the level-shifting circuit 102 between a high-voltage value (vdd_high) of the high voltage domain and a specified output node, to thereby contribute to tying (e.g., driving) the specified output node to a deterministic output value (e.g., a pre-defined logic state).

Similarly, a current-controlled tie-low (CCTL) circuit 114 includes a gate bias control circuit 116 and a tie-low circuit element 118. As illustrated and described below with respect to FIG. 3, the gate bias control circuit 116 may be configured to utilize voltage division to provide a specified gate bias voltage at a transistor of the tie-low circuit element 118. Then, one or more instances of the CCTL circuit 114 may be used to provide a controlled discharge with respect to a current through a connected node, and thereby contribute to tying the connected node to a low voltage (e.g., ground). In particular, as with the CCTH circuit 108, the CCTL circuit 114 provides a current that is large enough to contribute to maintaining the connected node at the desired low voltage level during the power-up sequence(s), while being small enough to reduce or eliminate any impact thereof during normal operations of the level-shifting circuit 102.

Thus, the CCTH circuit 108 and the CCTL circuit 114 are both used to tie connected nodes to specified (high or low) values. Whether a particular output node is tied high or low will depend on the node in question, a desired output state to be specified as the deterministic output state, and potentially other factors. Consequently, either of the CCTH circuit 108 and/or the CCTL circuit 114 may be referred to more generally as a current-controlled tie circuit(s).

During some instances of power-sequences that may occur, existing or included elements of the level-shifting circuit 102 may operate, or partially operate, and may contend with the operations of the CCTH circuit 108 and/or the CCTL circuit 114. For example, in some implementations, one or more transistors used during normal operations of the level-shifting circuit 102 experiences a leakage current(s) during one or more types of power-up sequences. Such a leakage current may cause a node tied high by the CCTH circuit 108 to have a reduced value, or may cause a node tied low by the CCTL circuit 114 to have a raised value.

In FIG. 1, one or more corresponding contention removal circuits 120 may be included to reduce or eliminate such effects. For example, as described below with respect to FIGS. 4 and 5, such a contention removal circuit 120 may be used to equalize a voltage across a transistor exhibiting such leakage currents. More particularly, the contention removal circuit 120 may operate using a feedback loop from an output node of the level-shifting circuit 102, in order to stabilize the equalized voltage at the necessary value.

Figure 2:
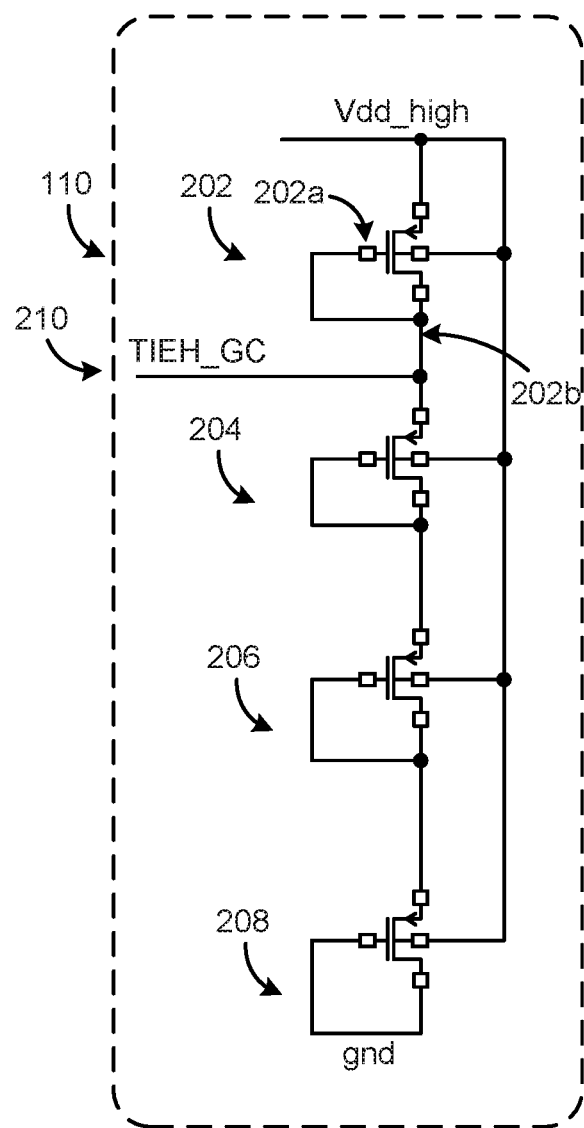
FIG. 2 is a first example of a gate-bias control circuit used in the level-shifting circuit of FIG. 1.

FIG. 2 is a first example of a gate-bias control circuit used in the level-shifting circuit of FIG. 1. In the example of FIG. 2, the gate-bias control circuit 110 is illustrated as including a stack of PMOS (p-type metal oxide semiconductor) transistors 202, 204, 206, and 208.

More particularly, the PMOS transistors 202-208 are connected as a diode-connected PMOS stack, in which a gate and drain of each PMOS 202-208 are connected, as shown (e.g., a gate 202a is connected to a drain 202b of the PMOS transistor 202). In such a connection, each PMOS transistor is saturated, and forms a two-terminal rectifying device in which a portion of the voltage vdd_high is dropped across each such device.

By selecting a suitable output node for a gate control output signal, shown in FIG. 2 as TIEH_GC 210, a desired gate bias voltage may be obtained for input into the CCTH circuit 108 of FIG. 1. In other words, it is possible to define a resistance, and associated voltage drop, across each of the diode-connected transistors 202-208, such as by selecting desired dimensions of each of the diode-connected transistors 202-208, or by selecting a necessary number of the diode-connected transistors 202-208 to connect in series. By defining the output TIEH_GC 210 between two specified ones of the diode-connected transistors 202-208, such as between diode-connected transistors 202 and 204 in the example of FIG. 2, it is therefore possible to obtain a specified, suitable fraction of the total high voltage value vdd_high.

Figure 3:
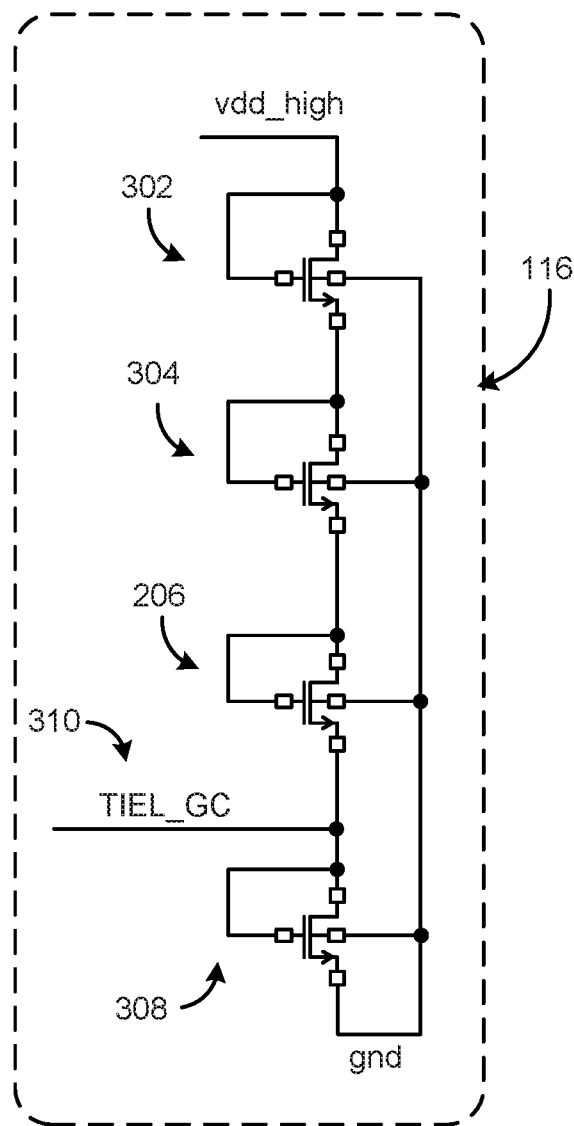
FIG. 3 is a second example of a gate-bias control circuit used in the level-shifting circuit of FIG. 1.

Similarly, in FIG. 3, an example of the gate-bias control circuit 116 is illustrated. In FIG. 3, diode-connected NMOS transistors are illustrated as being connected in series to provide an output gate control bias voltage shown in FIG. 3 as TIEL_GC 310. Again, appropriate selection of a construction and number of the diode-connected NMOS transistors may be made to enable provision of the output TIEL_GC 310 at a desired value.

Example uses of the gate bias control circuits 110, 116 of FIGS. 2 and 3 are provided in more detail, below, with respect to FIGS. 4 and 5. In general, the gate bias control circuits 110, 116 are merely example implementations, and other implementations are possible.

For example, some implementations may include a plurality of series resistors to provide the desired level of voltage division and associated current control. In comparison to the implementations of FIGS. 2 and 3, such resistors may exhibit larger leakage currents, and may consume greater areas of an integrated circuit chip on which the level-shifting circuit 102 is constructed.

FIG. 4 is a more detailed example of the level-shifting circuit 102 of FIG. 1, illustrated as a level-shifting circuit 402. The following description of FIG. 4 is provided first with description of a normal operating region of the level-shifting circuit 402, followed by descriptions of example operations of the CCTH circuit 108, as well as example operations of instances of the CCTL circuit 114 (illustrated in FIG. 4 as CCTL instances 114a, 114b), and example operations of instances of the contention removal circuit 120 (illustrated in FIG. 4 as contention removal circuit instances 120a, 120b).

In FIG. 4, a level-shifting circuit 402 is illustrated as receiving a $V_{IN}$ signal, which varies between 0 and vdd_low of the low voltage domain 104. PMOS transistor 404 and NMOS transistor 406 define a complementary MOS (CMOS) inverter, so that an output $V_{INB}$ is opposite in polarity with respect to the $V_{IN}$ signal during normal operations of the level-shifting circuit 402.

When $V_{IN}$ is logic low, $V_{INB}$ will be at logic high, i.e., vdd_low. Consequently, NMOS 408 will be on (e.g., in an on state). A second CMOS inverter is formed by PMOS 410 and NMOS 412, so that in this example, NMOS 414 will also be off (e.g., in an off state).

With this configuration, a first output node 416, sometimes referred to as Node 1, is pulled to ground, which then turns on PMOS 418, which pulls up a second output node 420 to the high voltage value vdd_high. As a result, PMOS 422 is turned off.

Conversely, when $V_{IN}$ is high, $V_{INB}$ is low, so that NMOS 408 is off while PMOS 418 is on. Consequently, PMOS 422 is turned on, which then pulls up the first output node (Node 1) 416 to vdd_high, which then causes PMOS 418 to be turned off.

In summary, during normal operation, the level-shifting circuit 402 provides a cross-coupled circuit in which the desired level-shifting is provided with respect to the two output nodes 416, 420, which have opposite polarities. In some implementations, either output node 416, 420 may be used for a desired output, which will therefore either have the same, or opposite, polarity as the input signal $V_{IN}$. Further, as illustrated and described with respect to FIG. 5, various additional or alternative circuit elements may be included, such as additional inverters and/or driving circuits.

During the types of power-up sequences referenced above, however, in some implementations the vdd_high becomes partially or completely available during a time when the vdd_low is not fully available. For example, vdd_low may be completely unavailable (off), or only partially available (e.g., while ramping to the full value of vdd_low).

In the following examples, during such power-up sequences, the level-shifting circuit 402 is described as being held at a deterministic output of logic "1" at the output node 416 (Node 1). In some implementations, if an additional inverter is applied as a driving circuit following the output node 416, then the logical output of that inverter would be logic "0." Further, since the polarity of the output node 420 (Node 2) is opposite in polarity to that of the output node 416, the level-shifting circuit 402 could also be described as being maintained in a deterministic state of logic "1" with respect to that output, or logic "0" if an inverter in an output driving circuit is applied following the output node 420.

During power-up sequences, prior to vdd_low being available, the CCTH circuit 108 pulls the output node 416 to vdd_high as vdd_high ramps from an off or unavailable value to a final value of vdd_high. More specifically, as described above with respect to FIGS. 1 and 2, a portion or percentage of the vdd_high is applied as a current control signal that limits a current to the output node 416. Consequently, the CCTH circuit 108 provides a current level that is sufficient to pull the output node 416 to high during the power-up sequences described herein, but that is negligible compared to (or overpowered by) contending currents and voltages that occur during normal operations of the level-shifting circuit 402.

In more detail, during a power-up sequence in which vdd_low is off and completely unavailable, then the inverters formed by 404, 406 and 410, 412 (which are powered by vdd_low) will be off. As a result, the portion of the level-shifting circuit 402 powered by vdd_low (i.e., below the dotted line in FIG. 4, NOT including NMOS transistors 408, 414) will be off.

During the time period in which vdd_high is ramping, CCTH circuit 108 is instrumental in ensuring that the output node 416 is pulled to a value corresponding to vdd_high, and high enough to maintain the output node 416 in a deterministic state (which, in the example, is a state of 'high,' or logic "1"). Put another way, without CCTH circuit 108 being included, the output node 416 might drift to an unknown voltage level during the described power-up sequence, thereby leading to the types of undesired downstream effects referenced above.

During similar or subsequent power-up sequences, vdd_low may itself begin to ramp, while vdd_high is still ramping, or at its final value. For example, vdd_low may be at a voltage that is higher than 0V, but below a threshold voltage of the various transistors below the dotted line in FIG. 4.

As a result, for example, the inverter formed by transistors 404 may begin to exhibit a sub-threshold leakage current, so that the voltage $V_{INB}$ reaches a value in the range of, e.g., hundreds of millivolts. This subthreshold leakage may be sufficient to partially turn on the NMOS transistor 408. Similarly, the inverter formed by transistors 410, 412 may be partially operable in this subthreshold regime, leading to partial conductance of the NMOS transistor 414.

Consequently, the NMOS transistor 408 has the potential to pull down a voltage of the output node 416, in undesired contention with the above-described operations of the CCTH circuit 108.

To reduce or eliminate these undesired effects, a CCTL circuit 114a is provided at the output of the inverter formed by transistors 404, 406. Due to the included gate bias circuitry within the CCTL circuit 114a, as described above with respect to FIGS. 1 and 3, the subthreshold value of $V_{INB}$ is at least partially discharged. Put another way, a current through the CCTL circuit 114a is sufficient to reduce or eliminate the subthreshold $V_{INB}$, while being small enough to provide little or no impact on normal operations of the level-shifting circuit 402 during a normal operating regime thereof.

Similarly, a CCTL circuit 114b is provided between the output node 420 and ground. As just referenced, the CCTL circuit 114b provides sufficient current to pull the output node 420 to a logic value of "low" or "0," while being small enough to provide little or no impact on normal operations of the level-shifting circuit 402 during a normal operating regime thereof.

Further in FIG. 4, a contention removal circuit 120b is operable to contribute to removing a contending effect of the NMOS transistor 408 in undesirably pulling down a value of the output node 416. In other words, the contention removal circuit 120b operates in tandem with, and in support of, the CCTL circuit 114a, with respect to reducing or eliminating a contention effect of the NMOS transistor 408.

Put another way, during a subthreshold or leakage operation of the NMOS transistor 408, the CCTL circuit 114a and the contention removal circuit 120b achieve a similar outcome by different methodologies. Specifically, the CCTL circuit 114a reduces (discharges) the gate voltage $V_{INB}$ at the gate of the NMOS transistor 408, which thus reduces an extent to which the NMOS transistor 408 might be turned on.

Similarly, the contention removal circuit 120b, being powered by vdd_high and activated by the value of the output node 420 (Node 2), tends to provide a voltage that zeros the voltage drop across the NMOS transistor 408 (i.e., a voltage drop across the NMOS transistor 408 between the output node 416 and the output of the contention removal circuit 120). With this voltage drop being zeroed, the NMOS transistor 408 will not conduct any current, even if the subthreshold voltage $V_{INB}$ is not fully discharged at the gate of the NMOS transistor 408 by the CCTL circuit 114a. A contention removal circuit 120a may be configured to remove a contention of the transistor 418 in a similar fashion, by causing a zero voltage drop across transistor 418 when operation of the transistor 418 might otherwise contend with operations of the level-shifting circuit 402 during power-up sequences, as described herein.

FIG. 5 is a more detailed example of the circuit of FIG. 4. FIG. 5 is generally similar in structure and operation to the level-shifting circuit 402 of FIG. 4, but includes more detailed example implementations of various sub-circuits of FIG. 4 (such as the CCTH circuit 108, the CCTL circuits 114a, 114b, and the contention removal circuits 120a and 120b). FIG. 5 also includes examples of additional circuit elements that may be included to facilitate desired or normal level-shifting operations following successful completion of the types of power-up sequences described herein.

In FIG. 5, a PMOS transistor 501 and a PMOS transistor 502 provide example implementations of the CCTH circuit 108, including powering of the PMOS transistor 501 by the tieh_gc signal 210, as described with respect to FIG. 2. More particularly, in FIG. 5, the PMOS transistor 501 provides a subthreshold or leakage current that is in the range to provide the effects described above (e.g., pulling an output node, shown as Node 1 517 in FIG. 5, to a value of high or logic "1", without impacting normal level-shifting operations once power-up sequences have completed).

Further, in FIG. 5, the PMOS transistor 502 is configured as a PMOS capacitor, which supplements and ensures operations of the PMOS transistor 501 when vdd_high is ramping at a high rate. At such high rates of ramping, the controlled current through the PMOS transistor 501 may not be fast enough to respond to the ramping vdd_high with respect to achieving the desired effect of pulling the output node 517 high. In other words, the PMOS transistor 502 operates as a coupling capacitor providing capacitance between vdd_high and the output node 517 that facilitates operations of the PMOS transistor 501. In some implementations, the PMOS transistor 502 may be replaced with a capacitor, rather than a PMOS connected as a capacitor.

Further in FIG. 5, PMOS transistors 503 and 504 may be observed to correspond generally to cross-coupled PMOS transistors 422 and 418 of FIG. 4. Similarly, NMOS transistors 508 and 509 correspond generally to NMOS transistors 408 and 414 of FIG. 4. Further, an inverter 514 corresponds to the inverter formed by transistors 404, 406 in FIG. 4, while an inverter 515 corresponds to the inverter formed by transistors 410, 412 in FIG. 4. As referenced above, the output node 517 corresponds to Node 1 416 in FIG. 4, so that an output node 518 may be understood to correspond to Node 2 420 in FIG. 4.

FIG. 5 includes several other circuit elements intended for use during normal level-shifting operations, following completion of the power-up sequences described herein. For example, during normal level-shifting operations, the vdd_high may be at a voltage value that is appreciably higher than that of vdd_low. As a result, it is possible that the transistors in the vdd_high portion of the circuit will have a greater effect in pulling the output node 517 to high, than the transistors in the vdd_low domain (e.g., the NMOS transistors 508, 512) will have in pulling the output node 517 to low. In other words, the output node 517 may not be pulled sufficiently low in situations when an intended effect is to have the output node 517 at a logic "low" value.

The PMOS transistor 505 may thus be included to limit the contention strength of the PMOS transistor 503. For example, as shown, the PMOS transistor 505 may be connected to the output of the inverter 514, so that when that output is at logic low in the vdd_low domain, the PMOS transistor 505 will be partially turned on. This partial activation of the PMOS transistor 505 limits an effect of the PMOS transistor 503 in pulling up the node 517 to a logic high value, when it should be at a logic low value.

Similarly, PMOS transistor 506 is included to facilitate desired operations of the PMOS transistor 504, by counterbalancing or limiting a strength thereof. NMOS transistor 512 is included to facilitate desired operations of the NMOS transistor 508, e.g., by enhancing the pull-down strength of the NMOS transistor 508 in pulling the output node 517 to a logic low value. Transistor 506 also works together with transistor 507 for leakage contention removal purpose, as described in detail, below.

Further in FIG. 5, an inverter 516 is included as a driving circuit for a desired output. For example, such a driving circuit may isolate or cancel noise in the output signal.

An NMOS transistor 511 is illustrated as an example of the CCTL circuit 114a of FIG. 4. As such, it illustrates control by the tiel_gc signal 310, as described above with respect to FIGS. 1 and 3. As described with respect to FIG. 4, the NMOS transistor 511 provides a discharge for subthreshold operations of the inverter 514, thereby reducing a subthreshold voltage at gates of the transistors 508, 512.

A PMOS transistor 510 corresponds to an example of the contention removal circuit 120. As described above with respect to FIGS. 1 and 4, the PMOS transistor 510 thus serves to reduce or eliminate a voltage drop across the NMOS transistor 508 when the output node 517 is high. The PMOS transistor 510 provides a voltage at the source side of NMOS transistor 508 that is substantially equal to that of the output node 517, which prevents the NMOS transistor from leaking charges on node 517.

An NMOS transistor 507 provides an example of another contention removal circuit 120 that operates during certain power-up sequences but that does not affect normal level-shifting operations (e.g., operations that occur once the power-up sequence has completed). Specifically, the PMOS transistor 506 may provide undesired contention through subthreshold leakage current, and may thus, again undesirably, charge the output node 518. In order to maintain the output node 518 in its desired state of logic low when the output node 517 is in its desired state of logic high, the NMOS transistor 507 utilizes feedback from the output node 517 to discharge the node between the PMOS transistors 504, 506, when the output node 517 is high. In other words, when the output node 517 is high, the NMOS transistor 507 is turned on, which, as shown, discharges the voltage between the PMOS transistors 504, 506 to ground, and thereby facilitates maintaining a logic low state of the output node 518.

Further in FIG. 5, an NMOS transistor 513 provides another example of a CCTL circuit, such as the CCTL circuit 114b of FIG. 4. As described with respect to FIGS. 1, 3, and 4, the tiel_gc signal 310 causes a reduced or subthreshold leakage current through the NMOS transistor 513, which discharges the output node 518 (Node 2) and helps to ensure that the output node 518 is maintained at the desired logic low value during certain power-up sequences, without having an impact on normal level-shifting operations of the circuit of FIG. 5.

In the above descriptions of FIGS. 1-5, examples are provided in which various combinations of PMOS and NMOS transistors are used. Also, description is provided of level-shifting between a low voltage domain and a high voltage domain. However, in other implementations, in some implementations some or all of the transistor types and/or direction of level-shifting are reversed.

Thus, the present description includes and describes a plurality of p-type metal oxide semiconductor (PMOS) devices and n-type metal oxide semiconductor (NMOS) devices arranged and configured to level-shift an input voltage signal between a low voltage domain having a low voltage level and a high voltage domain having a high voltage level, to obtain an output voltage signal having an output voltage level at an output node. The level-shifting circuits described herein include a current-controlled tie circuit connected between the output node and the output voltage level, and configured to conduct a current that causes the output node of the level-shifting circuit to be in a pre-defined logic state during a power-up sequence of the level-shifting circuit.

The tie transistor may be configured to conduct a subthreshold current that causes the output node of the level-shifting circuit to be in the pre-defined logic state during the power-up sequence of the level-shifting circuit, where the high voltage level becomes at least partially available during the power up sequence, prior to the low voltage level being reached. The level-shifting circuit may then execute the level-shifting of the input voltage signal during the operating region following completion of the power up sequence, where the subthreshold current continues to occur during the normal operating region without affecting the level-shifting.

Further, it will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A level-shifting circuit, comprising:
a plurality of p-type metal oxide semiconductor (PMOS) devices and n-type metal oxide semiconductor (NMOS) devices arranged and configured to level-shift an input voltage signal between a low voltage domain having a low voltage level and a high voltage domain having a high voltage level, to obtain an output voltage signal having an output voltage level at a first output node;
a tie high circuit, connected between the first output node and a high voltage terminal, including a tie high transistor connected between the high voltage terminal of the high voltage domain and the first output node, the tie high transistor having a first gate terminal with a first gate voltage maintained during a power-up sequence of the level-shifting circuit that causes the tie high transistor to conduct a first subthreshold current that causes the first output node of the level-shifting circuit to be in a first pre-defined logic state during the power-up sequence of the level-shifting circuit; and
a tie low circuit that includes a tie low transistor connected between a ground terminal and a second output node that is complementary to the first output node the tie low transistor configured to conduct a second subthreshold current that causes the second output node to be in a second pre-defined logic state during the power-up sequence,
wherein the tie high circuit comprises a first gate-bias control circuit connected to the high voltage terminal and configured to apply the first gate voltage to the tie high transistor, and
wherein the tie low circuit includes a second gate-bias control circuit connected to the high voltage terminal and configured to apply the second gate voltage to the tie low transistor.

2. The level-shifting circuit of claim 1, wherein the first gate bias control circuit includes a plurality of resistive devices and the first gate voltage is determined using voltage division.

3. The level-shifting circuit of claim 2, wherein the resistive devices include diode-connected transistors.

4. The level-shifting circuit of claim 1, comprising a contention removal circuit connected to at least one of the plurality of PMOS and NMOS transistors in a leakage path that changes the first pre-defined logic state and thereby contends with the tie high circuit, the contention removal circuit powered by feedback from the second output node to equalize source terminal and drain terminal voltages across the at least one of the plurality of PMOS and NMOS transistors in the leakage path, to prevent the leakage current flowing therethrough.

5. The level-shifting circuit of claim 4, comprising:
a second tie low circuit connected between the leakage path and ground, to thereby discharge voltage activating the at least one of the plurality of PMOS and NMOS transistors in the leakage path.

6. The level-shifting circuit of claim 1, comprising:
a coupling capacitor connected in parallel with the tie high circuit.

7. The level-shifting circuit of claim 1, wherein the power-up sequence includes the high voltage level becoming at least partially available prior to the low voltage level being reached.

8. The level-shifting circuit of claim 1, wherein the second pre-defined logic state is a logic value of low at the second output node.

9. The level-shifting circuit of claim 1, comprising a contention removal circuit connected to at least one of the plurality of PMOS and NMOS transistors in a leakage path that changes the second pre-defined logic state and thereby contends with the tie low circuit, the contention removal circuit powered by feedback from the first output node to equalize source terminal and drain terminal voltages across the at least one of the plurality of PMOS and NMOS transistors in the leakage path, to prevent the leakage current flowing therethrough.

10. The level-shifting circuit of claim 1, wherein the tie low transistor has a second gate terminal with a second gate voltage maintained during the power-up sequence that causes the tie low transistor to conduct the second subthreshold current.

11. A level-shifting circuit, comprising:
a plurality of p-type metal oxide semiconductor (PMOS) devices and n-type metal oxide semiconductor (NMOS) devices arranged and configured to level-shift an input voltage signal from a low voltage domain having a low voltage level to a high voltage domain having a high voltage level, to obtain an output voltage signal having an output voltage level at a first output node;
a tie high circuit connected between the first output node and a high voltage terminal and including a tie high transistor configured to cause the first output node to be in a first pre-defined logic state during a power-up sequence of the level-shifting circuit in which the high voltage level becomes at least partially available prior to the low voltage level being reached;
a tie low circuit that includes a tie low transistor connected between a ground terminal and a second output node that is complementary to the first output node, the tie low transistor configured to cause the second output node to be in a second pre-defined logic state during the power-up sequence; and
a contention removal circuit connected to at least one of the plurality of PMOS and NMOS transistors in a leakage path that changes the first pre-defined logic state and thereby contends with the tie high circuit, the contention removal circuit powered by feedback from the second output node to equalize source terminal and drain terminal voltages across the at least one of the plurality of PMOS and NMOS transistors in the leakage path, to prevent the leakage current flowing therethrough.

12. The level-shifting circuit of claim 11, wherein the level-shifting circuit executes the level-shift of the input voltage signal during an operating region following completion of the power up sequence, and further wherein a subthreshold current of the tie high circuit that occurs during the power-up sequence continues to occur during the operating region without affecting the level-shifting circuit.

13. The level-shifting circuit of claim 11, wherein the tie high circuit comprises:
a gate-bias control circuit connected to the high voltage terminal and configured to partially turn on the tie high transistor to conduct a subthreshold current that causes the first output node to be in the first pre-defined logic state.

14. The level-shifting circuit of claim 13, wherein the gate bias control circuit includes a plurality of resistive devices and a gate bias of the tie high transistor is determined using voltage division.

15. The level-shifting circuit of claim 14, wherein the resistive devices include diode-connected transistors.

16. The level-shifting circuit of claim 11, comprising a gate-bias control circuit connected to the high voltage terminal and configured to partially turn on the tie low transistor to conduct a subthreshold current that causes the second output node to be in the second pre-defined logic state.

17. The level-shifting circuit of claim 11, further comprising:
a second contention removal circuit connected to at least one of the plurality of PMOS and NMOS transistors in a second leakage path that changes the second pre-defined logic state and thereby contends with the tie low circuit, the second contention removal circuit powered by feedback from the first output node to equalize source terminal and drain terminal voltages across the at least one of the plurality of PMOS and NMOS transistors in the second leakage path, to prevent the second leakage current flowing therethrough.

18. A level-shifting circuit, comprising:
a plurality of p-type metal oxide semiconductor (PMOS) devices and n-type metal oxide semiconductor (NMOS) devices arranged and configured to level-shift an input voltage signal from a low voltage domain having a low voltage level to a high voltage domain having a high voltage level during an operating region of the level-shifting circuit, the operating region occurring after a power up sequence of the low voltage domain and the high voltage domain in which the high voltage level becomes at least partially available prior to the low voltage level being reached;
a tie high circuit connected between a high voltage terminal of the high voltage domain and a first output node of the level-shifting circuit, and biased by a first specified fraction of the high voltage level available during the power up sequence to conduct a first subthreshold current that ties the first output node to the high voltage level as the high voltage level increases during the power up sequence and until the low voltage level is reached;

a tie low circuit connected between a second output node of the level-shifting circuit and ground, and biased by a second specified fraction of the high voltage level available during the power up sequence to conduct a second subthreshold current that ties the second output node to ground as the high voltage level increases during the power up sequence and until the low voltage level is reached; and a contention removal circuit connected to at least one of the plurality of PMOS and NMOS transistors in a leakage path that changes the second pre-defined logic state and thereby contends with the tie low circuit, the contention removal circuit powered by feedback from the first output node to equalize source terminal and drain terminal voltages across the at least one of the plurality of PMOS and NMOS transistors in the leakage path, to prevent the leakage current flowing therethrough.

19. The level-shifting circuit of claim 18, wherein the first subthreshold current and the second subthreshold current continue to occur during the operating region without affecting the level-shifting circuit.

20. The level-shifting circuit of claim 18, wherein the tie high circuit comprises:
a tie high transistor; and
a gate-bias control circuit connected to the high voltage terminal,
wherein the first specified fraction of the high voltage level is determined using the gate-bias control circuit.

* * * * *